United States Patent [19]

Yamagami

[11] Patent Number: 4,634,891

[45] Date of Patent: Jan. 6, 1987

[54] GATE TURN-OFF THYRISTOR MODULE

[75] Inventor: Kozo Yamagami, Hyogo, Japan

[73] Assignee: Mitsubishi Denki Kabushiki Kaisha, Tokyo, Japan

[21] Appl. No.: 592,208

[22] Filed: Mar. 22, 1984

[30] Foreign Application Priority Data

Mar. 22, 1983 [JP] Japan .................................. 58-48151

[51] Int. Cl.⁴ ...................... H03K 17/72; H03K 17/14
[52] U.S. Cl. ............................ 307/252 C; 307/252 H; 307/305; 357/72; 357/76
[58] Field of Search .......... 307/252 R, 252 A, 252 C, 307/252 H, 305, 303; 357/72, 74, 75, 76, 81

[56] References Cited

U.S. PATENT DOCUMENTS 4,335,392 6/1982 Reiter .
4,518,982 5/1985 Du Bois et al. ........................ 357/75

FOREIGN PATENT DOCUMENTS 2800340 7/1979 Fed. Rep. of Germany .
3211975 10/1982 Fed. Rep. of Germany .
3127456 2/1983 Fed. Rep. of Germany .
3245762 9/1983 Fed. Rep. of Germany .
WO79/00817 10/1979 PCT Int'l Appl. .
WO82/02980 9/1982 PCT Int'l Appl. .

OTHER PUBLICATIONS

GTO–Thyristoren, Peter Wilson, No. 18/9.9, 1983, pp. 115–118.
Der Gate-Abschaltbare Thyristor und Seine Ansteuerung, Electronik-Applikation 15 pages, 1983, No. 3, pp. 47–50.
Switch-Off Behavior, Elektrie, 35, 1981, vol. 3, pp. 119–122, F. Fisher, and H. Conrad.
Transistoren-Thristoren-GTOs, Dr. K. Platzoder, Elektrie 35, 7-1983, pp. 32–34.
Thyristors: Future Workhorses in Power Transmission, IEEE Spectrum, Dec. 1982, pp. 40–45.

Primary Examiner—John Zazworsky
Attorney, Agent, or Firm—Sughrue, Mion, Zinn, Macpeak, and Seas

[57] ABSTRACT

A gate turn-off thyristor module having reduced circuit inductances. One or more gate turn-off thyristor chips are housed in a resin package. The main electrode and control terminals are disposed on an upper face of the package, while terminals for making connections to a snubber circuit are positioned at a different height from the main electrode control terminals. Preferably, the snubber circuit connecting terminals are located as close as possible to the respective electrode of their corresponding thyristor chip.

9 Claims, 9 Drawing Figures

GATE TURN-OFF THYRISTOR MODULE

BACKGROUND OF THE INVENTION

The present relates to a gate turn-off thyristor (GTO) module. More particularly, the invention relates to the arrangement of outer electrodes in a package of a GTO module.

At present, much effort is underway to devise new techniques to conserve energy. Particularly, a great deal of effort has gone into saving electrical energy through the provision of improved high-power switching devices. The GTO is one device which has shown much promise because of its small physical size but large current switching ability. This device finds use, for instance, in inverter circuits used for motor control.

It has been the practice to modularize circuits employing GTOs in order to reduce their overall size. FIG. 1 shows an example of a GTO module of the prior art. In this module, two GTO chips, GTO1 and GTO2, are connected in series. A portion 100 encircled by a broken line represents an internal part of package. Reference numeral 101 designates an output anode terminal A2 connected to the anode electrode of GTO2, 102 a main cathode terminal K1 connected to the cathode electrode of GTO1, and 103 a common main terminal connected to the anode electrode of GTO1 and to the cathode electrode of GTO2. The terminal 103 also serves as an anode terminal A1 of GTO1 and as a cathode terminal K2 of GTO2. 108 and 109 indicate a control gate terminal G1 and a cathode terminal K1a connected, respectively, to the gate electrode and the cathode electrode of GTO1. 110 and 111 designate a control gate terminal G2 and a cathode terminal K2a connected, respectively, to the gate electrode and the cathode electrode of GTO2.

Generally, in the case where the GTO is employed in an inverter or chopper ciruit, a snubber circuit is connected between the anode electrode and the cathode electrode of the GTO. One of the reasons for using the snubber circuit is to bypass the current flowing through the GTO at the time of turning off the GTO to decrease swiftly the current flowing through GTO, thereby to reduce the power loss in the GTO. Another reason is to prevent re-ignition at the turn-off failure of the GTO by suppressing spike voltage build-up by inductance in the snubber circuit during fall period.

The snubber circuit is connected between anode and cathode terminals of each of the two GTOs (GTO1 and GTO2) in a two-device module. More specifically, in FIG. 1 reference numeral 140 indicates a snubber circuit for GTO1 composed of a diode $D_{s1}$ and a capacitor $C_{s1}$ connected in series, and a resistor $R_{s1}$ connected in parallel across the diode $D_{s1}$. 150 indicates a similar circuit for GTO2 composed of a diode $D_{s2}$, a capacitor $C_{s2}$, and a resistor $R_{s2}$. The values of the capacitors and resistors and the types of diodes forming the snubber circuits are selected to provide optimum characteristics of the GTO module in accordance with the particular application at hand.

FIG. 2 is a perspective view showing the exterior configuration of a conventional GTO module having an internal structure as shown in FIG. 1. In FIG. 2, 100 indicates a resin package and 130 a heat radiating plate made of copper sheeting. 101, 102 and 103 designate the main electrode terminals, 108 and 109 control electrode terminals of GTO1 and 110 and 111 control electrode terminals of GTO2. 120 indicates a hole used to fix the module to a radiating fin by means of a screw.

FIG. 3A shows such a GTO module applied to an inverter circuit. Specifically, FIG. 3A shows one phase of the inverter circuit. FIGS. 3B through 3E show voltage and current waveforms at respective points taken at the turn-off time of the GTO devices. Specifically, FIG. 3B shows the waveform of a voltage $V_{AK}$ across the anode and cathode of a GTO at turn-off. As seen in FIG. 3B, voltage transients indicated by $\Delta V_{AK}$ and $V_{DP}$ occur during the turn-off time. These can be expressed by the following equations:

$$\Delta V_{AK} = \sqrt{\frac{L_{T1}}{C}} \cdot I_T, \text{ and} \quad (1)$$

$$V_{DP} = \frac{dI_T}{dt} \cdot L_{T2}, \quad (2)$$

where, $L_{T1}=l_3+l_4+l_5+l_6+l_8+$, $L_{T2}=l_1+l_2+l_3+l_4$, and $l_1, l_2, l_3, l_4, l_5, l_6, l_7,$ and $l_8$ are inductances of respective connecting wires as indicated in FIG. 3A. Among the transients, $\Delta V_{AK}$ is important to the breakdown voltage of the GTO and $V_{DP}$ is important with respect to the switching loss in the GTO at the time of turn-off. The voltage $V_{DP}$ increases in proportion to the wire inductance $L_{T2}$. Also, as the wire inductance $L_{T2}$ increases, the switching loss at turn-off increases. The GTO may in fact be destroyed if the switching loss is sufficiently high. Accordingly, it is necessary to shorten the lengths of the connecting wires to, from and within the snubber circuit to reduce the inductances of those wires.

In a conventional GTO module having a wire structure and exterior configuration as shown in FIGS. 1 and 2, the snubber circuit 140 for GTO1 is connected between the main anode terminal 103 and main cathode terminal 102 and the snubber circuit 150 for GTO2 is connected between main anode terminal 101 and main cathode terminal 103. Such a GTO module has the following drawbacks:

(1) Because the main electrode terminals serve commonly as connection terminals for the snubber circuit, the total length of the wiring of the snubber circuit and the wiring to the electrode main terminals of the GTO is determined principally by the size of the device package, and hence even if the external wiring of the snubber circuit were shortened, the total inductances would not be sufficiently reduced.

(2) Because the main electrode terminals serve commonly as connection terminals to connect the snubber circuit to the GTO, it is necessary to connect two wire to each main electrode terminal, hence making the apparatus difficult to assemble and repair.

SUMMARY OF THE INVENTION

The invention was achieved in view of the foregoing drawbacks of the prior art device.

A specific object of the invention is to provide a GTO module in which the wiring inductances of the snubber circuit are reduced, the transient voltages imposed on the GTOs at turn-off are reduced, the switching loss is decreased, and the external wiring is simplified.

In accordance with the above and other objects of the invention, a gate turn-off thyristor module is provided including a package, which may be a parallelpiped resin package, having at least one gate turn-off thryristor chip housed therein. Main anode and cathode terminals and a gate control terminal are disposed on an upper face of the package and are connected to the anode electrode, cathode electrode and gate electrode of the respective turn-off thyristor chip. Snubber circuit connecting terminals are disposed on the package at a position at a different height from the main anode terminal, main cathode terminal and control gate terminal. Preferably, the snubber circuit connecting terminals are positioned as close as possible to the respective electrodes of the thyristor chip so as to minimize circuit inductances.

DESCRIPTION OF THE PREFERRED EMBODIMENTS

Figure 4:
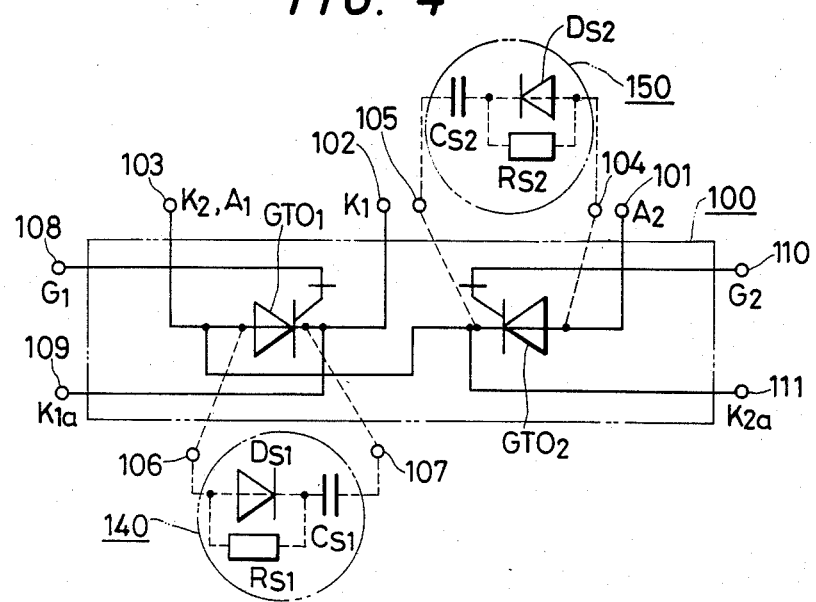
FIG. 4 is a diagram showing wiring connections of a GTO module in accordance with the invention.
Figure 5:
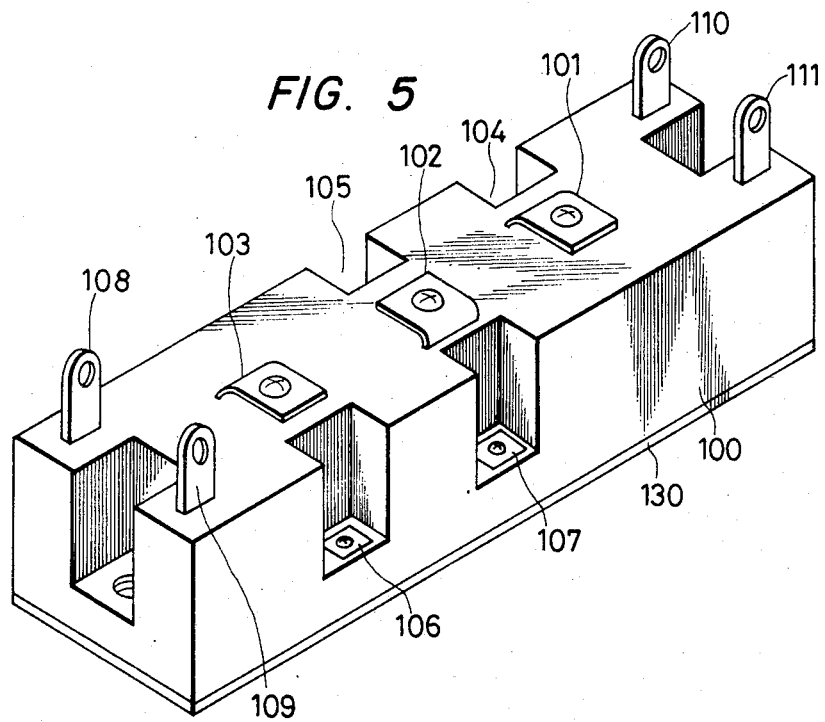
FIG. 5 is a perspective view showing the external configuration of the GTO module of the invention.

The circuit structure of a GTO module of the invention is shown in FIG. 4, and the external configuration of this GTO module is shown in FIG. 5.

Figure 1:
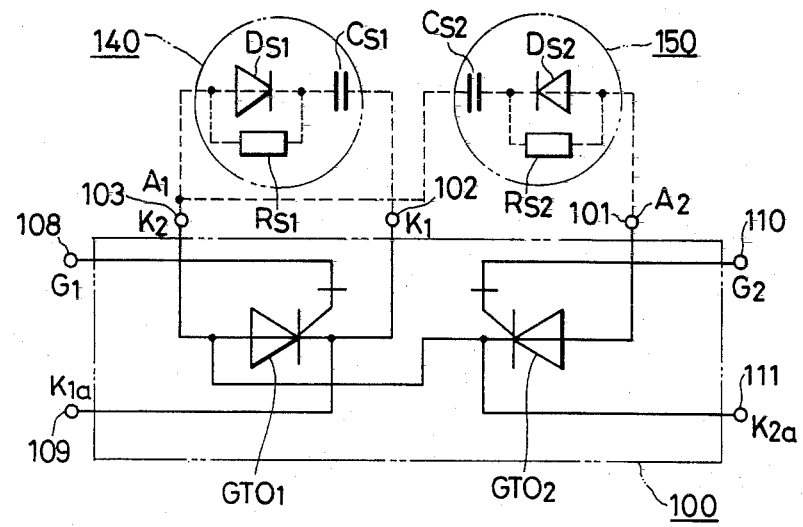
FIG. 1 is a configuration diagram showing an example of wiring connections in a conventional GTO module.
Figure 2:
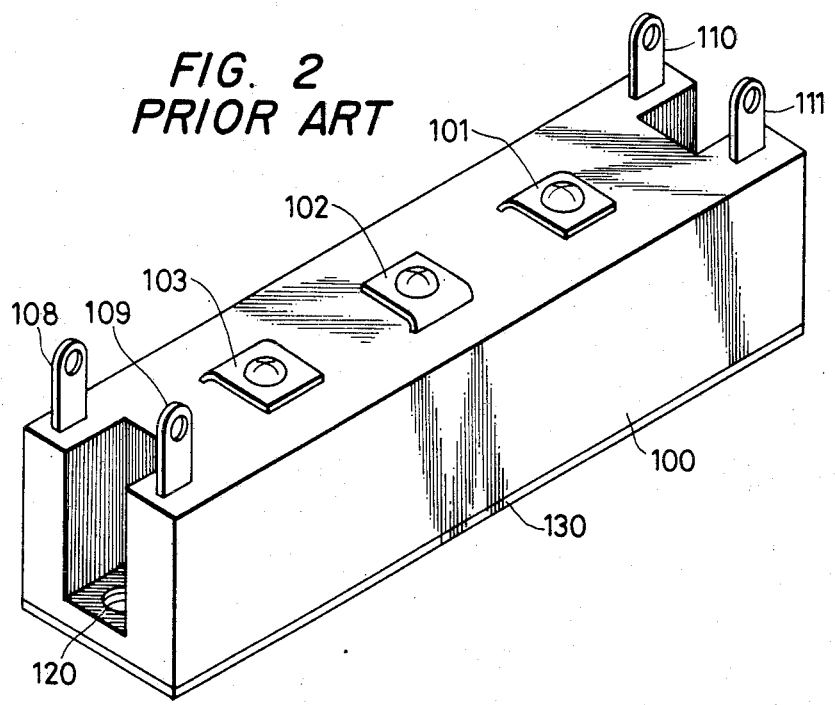
FIG. 2 is a perspective view showing the external configuration of the conventional GTO module.
Figure 3A:
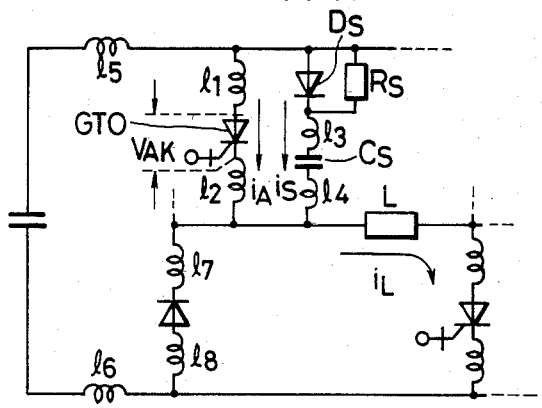
FIG. 3A is a circuit diagram showing the conventional GTO employed in an inverter circuit.
Figure 3B:
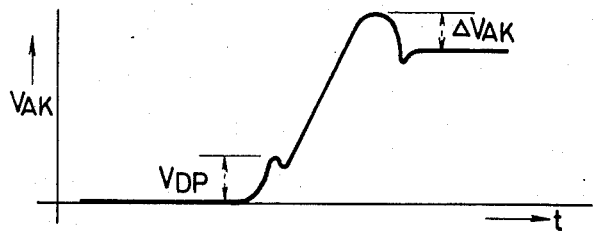
FIGS. 3B through 3E are waveform diagrams showing voltage waveforms and current waveforms appearing at various points in the circuit of FIG. 3A at the turn-off of the GTO.
Figure 3C:
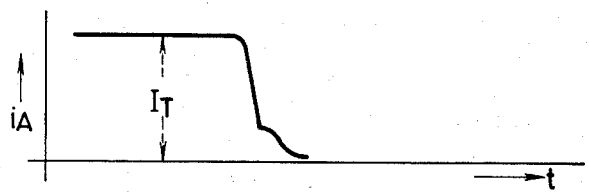
Figure 3D:
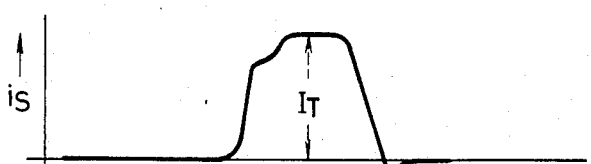
Figure 3E:
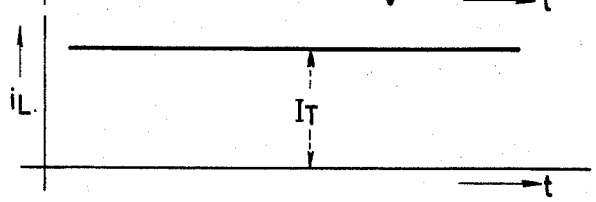

The GTO module of the invention shown in FIG. 4 differs from the conventional GTO module shown in FIG. 1 in that terminals for connection of the snubber circuit are provided which are connected through internal leads directly to the anode electrode and the cathode electrode of each GTO element (GTO1 and GTO2). The snubber circuit connecting terminals are located extremely close to the corresponding GTO electrodes and are provided independently of the main electrode terminals. Specifically, there are provided independent snubber circuit connecting terminals 106 and 107 for GTO1 and snubber circuit connecting terminals 104 and 105 for GTO2. The connections inside the package 100 are made, as represented by broken lines in FIG. 4, in such a manner that the lengths of the internal leads are very short.

The external configuration of the GTO module of FIG. 4 is shown in FIG. 5. An anode electrode side terminal 106 and a cathode electrode side terminal 107 for connection of the snubber circuit for GTO1 are provided independently of the main anode electrode terminal 103 and the main cathode electrode terminal 102 of GTO1. In order to facilitate the assembly and repair of the apparatus in which the module is used, the height of the main electrode output terminals is made different from that of the snubber circuit terminals. In the exemplary external view of FIG. 5, the position of the terminals for the snubber circuit is lower than that of the main electrode terminals. However, a similar effect can be obtained if the positions of the two types of terminals are reversed.

The structure according to the invention described hereinabove results in the following effects:

(A) The wiring to the snubber circuit is shortened, thereby reducing the transient voltage $V_{DP}$ impressed across the anode and cathode of the GTO at turn-off, and hence reducing the switching losses at turn-off.

(B) Further, because the terminals for snubber circuit connection are located at different levels from the main electrode terminals, the work of connecting the snubber circuit and connecting the input-output leads to the main electrode terminals and the work of removing and attaching the external wires for the purpose of maintenance and repair can be performed smoothly.

What is claimed is:

1. A gate turn-off thyristor module comprising:
   a package;
   at least one gate turn-off thyristor chip housed in said package;
   a main anode terminal, a main cathode terminal, and a gate control terminal disposed on an upper face of said package provided for said gate turn-off thyristor chip and connected to an anode electrode, a cathode electrode, and a gate electrode of said gate turn-off thyristor chip;
   snubber circuit connecting terminals for a snubber circuit external to said module disposed at a position different in height from that of said main anode terminal and said main cathode terminal provided for said gate turn-off thyristor chip and connected to said anode electrode and cathode electrode of the gate turn-off thyristor chip; and
   internal connecting wires extending from said anode electrode and said cathode electrode to said snubber circuit connecting terminals which are shorter than internal connecting wires connecting said anode electrode and said cathode electrode to said main anode terminal and said main cathode terminal, respectively.

2. A gate turn-off thyristor module comprising:
   a series connection of a first gate turn-off thyristor chip and a second gate turn-off thyristor chip;
   a substantially paralledpiped package for housing said series connection;
   a first main cathode terminal disposed in said package such that at least an end portion thereof is exposed on an upper surface of said package, said first main cathode terminal being connected to a cathode of said first gate turn-off thyristor;
   a second main anode terminal disposed in said package such that at least an end portion thereof is exposed on said upper surface, said second main anode terminal being connected to an anode of said second gate turn-off thyristor;
   a main first-anode/second-cathode terminal disposed in said package such that at least an end portion thereof is exposed on said upper surface, said main first-anode second-cathode terminal beng connected to an anode of said first gate turn-off thyristor and to cathode of said second gate turn-off thyristor;
   a first gate control terminal disposed in said package such that at least an end portion thereof is exposed on said upper surface, said first gate control terminal being connected to a gate of said first gate turn-off thyristor;
   a first cathode control terminal disposed in said package such that at least an end portion thereof is exposed on said upper surface, said first cathode control terminal being connected to said cathode of said first gate turn-off thyristor;

a second gate control terminal disposed in said package such that at least an end portion thereof is exposed on said upper surface, said second gate control terminal being connected to said gate of said second gate turn-off thyristor;

a second cathode control terminal disposed in said package such that at least an end portion thereof is exposed on said upper surface, said second cathode control terminal being connected to a cathode of said second gate turn-off thyristor;

a pair of first external terminals for making connections to a first snubber circuit external to said module, said first external terminals being disposed on said package such that at least end portions thereof are exposed on side surface of said package, said first external terminals being respectively connected to said anode and cathode of said first gate thyristor; and a pair of second external terminals for making connections to a second snubber circuit external to said module, said second external terminals being disposed on said package such that at least end portions thereof are exposed on a side surface of said package, said second external terminals being respectively connected to said anode and cathode of said second gate turn-off thyristor.

3. The gate turn-off thyristor module as claimed in claim 2, wherein said package is formed by molding a resin.

4. The gate turn-off thyristor module as claimed claim 1, wherein said exposed end portions of said first main cathode terminal, said second main anode terminal and said main first-anode/second-cathode terminal are arranged in a center area of said upper surface of said package, said exposed end portions of said first gate control terminal and said first cathode control terminal are arranged in one end area of said upper surface, and said exposed end portions of said second gate control terminal and said second cathode control terminal are arranged in the other end area of said upper surface.

5. The gate turn-off thyristor module as claimed in claim 4, wherein said exposed end portions of said first external terminals are arranged in one side surface of said package and said exposed end portions of said second external terminals are arranged in the opposite side surface of said package.

6. The gate turn-off thyristor module as claimed in claim 5, wherein said package is formed in said opposite side surfaces with stepped portions, and wherein said exposed end portions of said first external terminals are arranged in said stepped portion in one of said side surfaces of said package, and said exposed end portions of said second external terminals are arranged in said stepped portion in the other side surface of said package.

7. The gate turn-off thyristor module as claimed in claim 5, wherein said package is formed in opposite side surfaces thereof with a pair of stepped portions, at least said end portions of said first external terminals being exposed on said pair of stepped portions formed in one of said side surfaces of said package, and at least said end portions of said second external terminals being exposed on said pair of stepped portions formed in the other side surface.

8. The gate turn-off thyristor module as claimed in claim 2, wherein said exposed end portions of said first and second external terminals are disposed at a different level from those of said exposed end portions of said first main cathode terminal, said second main anode terminal and said main first-anode/second-cathode terminal.

9. The gate turn-off thyristor module as claimed in claim 8, wherein said exposed end portions of said first main cathode terminal, said second main anode terminal, said main first-anode/second-cathode terminal are disposed in a center area of said upper surface of said package, said exposed end portions of said first gate control electrode and said first cathode control electrode are disposed in one end area of said upper surface, said exposed end portions of said second gate control electrode and said second cathode control electrode are disposed in the other end area of said upper surface, said exposed end portions of said first external terminals are disposed in one of said side surfaces of said package and said exposed end portions of said second external terminals are disposed in the other side surface of said package.

* * * * *